(12) United States Patent
Bathan et al.

(10) Patent No.: US 12,176,273 B2
(45) Date of Patent: Dec. 24, 2024

(54) SEMICONDUCTOR DEVICE AND METHOD OF FORMING SUBSTRATE WITH 3-SIDED WETTABLE FLANK

(71) Applicant: Semtech Corporation, Camarillo, CA (US)

(72) Inventors: Henry D. Bathan, Simi Valley, CA (US); Yingyu Chen, Camarillo, CA (US)

(73) Assignee: Semtech Corporation, Camarillo, CA (US)

( * ) Notice: Subject to any disclaimer, the term of this patent is extended or adjusted under 35 U.S.C. 154(b) by 89 days.

(21) Appl. No.: 17/645,500

(22) Filed: Dec. 22, 2021

(65) Prior Publication Data

US 2023/0197583 A1   Jun. 22, 2023

(51) Int. Cl.
| | |
|---|---|
| *H01L 21/48* | (2006.01) |
| *H01L 23/13* | (2006.01) |
| *H01L 23/31* | (2006.01) |
| *H01L 23/495* | (2006.01) |
| *H01L 23/498* | (2006.01) |

(52) U.S. Cl.
CPC .... *H01L 23/49565* (2013.01); *H01L 23/4952* (2013.01); *H01L 23/49548* (2013.01)

(58) Field of Classification Search
CPC ........... H01L 23/49565; H01L 23/4952; H01L 23/49548; H01L 23/13; H01L 23/49805; H01L 23/49861
See application file for complete search history.

(56) References Cited

U.S. PATENT DOCUMENTS

| | | |
|---|---|---|
| 8,076,181 B1 | 12/2011 | Pruitt et al. |
| 9,287,238 B2 | 3/2016 | Goh et al. |
| 9,806,043 B2 | 10/2017 | Lee et al. |
| 10,199,311 B2 | 2/2019 | Truhitte et al. |
| 10,366,943 B2 | 7/2019 | Kim et al. |
| 10,756,006 B2 | 8/2020 | Truhitte et al. |
| 10,825,755 B2 | 11/2020 | Rivera-Marty |
| 10,892,211 B2 | 1/2021 | Bathan |
| 2004/0238923 A1 | 12/2004 | Lee et al. |
| 2012/0286410 A1 | 11/2012 | Groenhuis et al. |

(Continued)

FOREIGN PATENT DOCUMENTS

| | | |
|---|---|---|
| EP | 2490270 A2 | 8/2012 |
| EP | 3442018 A1 | 2/2019 |
| JP | 2014168102 A | 9/2014 |

*Primary Examiner* — Omar F Mojaddedi
(74) *Attorney, Agent, or Firm* — Robert D. Atkins; PATENT LAW GROUP: Atkins and Associates, P.C.

(57) ABSTRACT

A semiconductor device has a substrate and leads formed on two or more sides of the substrate. An electrical component is disposed over the substrate and electrically connected to the lead with bumps or bond wires. The electrical component is encapsulated. A portion of the substrate is removed to form a wettable flank on at least three sides of the lead. The substrate has a molding compound and the lead is disposed within or adjacent to the molding compound. A portion of the molding compound can remain at corners of the substrate. The lead has a first surface or recessed surface on a first side of the lead, a second surface or recessed surface on a second side of the lead, and a third surface or recessed surface on a third side of the lead. A portion of a surface of the lead is plated.

25 Claims, 15 Drawing Sheets

(56) References Cited

U.S. PATENT DOCUMENTS

| | | |
|---|---|---|
| 2017/0133304 A1 | 5/2017 | Williams |
| 2017/0294367 A1 | 10/2017 | Kitnarong et al. |
| 2018/0145013 A1* | 5/2018 | Truhitte ............ H01L 23/49551 |
| 2020/0144164 A1* | 5/2020 | Rivera-Marty ... H01L 23/49541 |
| 2020/0227343 A1 | 7/2020 | Huang |
| 2020/0395272 A1* | 12/2020 | Bang .................... H01L 21/561 |
| 2021/0013142 A1 | 1/2021 | Yeo et al. |
| 2022/0115304 A1* | 4/2022 | Bowers ............ H01L 23/49517 |

* cited by examiner

SEMICONDUCTOR DEVICE AND METHOD OF FORMING SUBSTRATE WITH 3-SIDED WETTABLE FLANK

FIELD OF THE INVENTION

The present invention relates in general to semiconductor devices and, more particularly, to a semiconductor device and method of forming a substrate with a 3-sided wettable flank.

BACKGROUND OF THE INVENTION

Semiconductor devices are commonly found in modern electronic products. Semiconductor devices perform a wide range of functions, such as signal processing, high-speed calculations, sensors, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

A semiconductor die can be mounted to a leadframe or other substrate for electrical interconnect and encapsulated for structural support and environmental protection. The substrate has two or more leads exposed on one side of the lead. The external connection is made to the top of the lead and, at most, a single exposed side surface. The lead with interconnection by the top surface and one side surface has low package shear strength, particularly for small packages, such as 0603 type package or dual flat no lead (DFN) package. The low package shear strength can cause defects, such as package tilt or other package placement instability during board surface mounting. The lead with interconnection by the top surface and one side surface has no solder joint inspection capability by automated optical inspection (AOI) tools.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

Figure 1A:
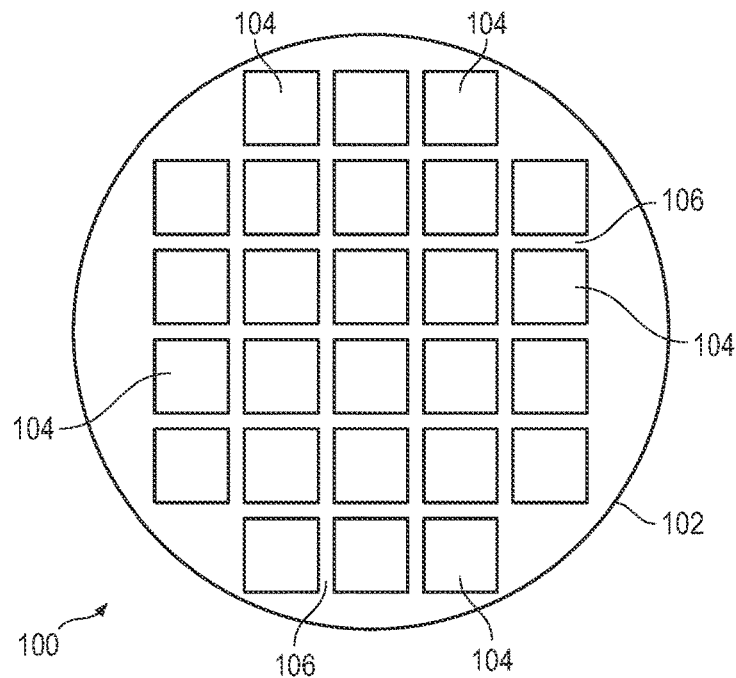
FIGS. 1a-1c illustrate a semiconductor wafer with a plurality of semiconductor die separated by a saw street.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk material for structural support. A plurality of semiconductor die or components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
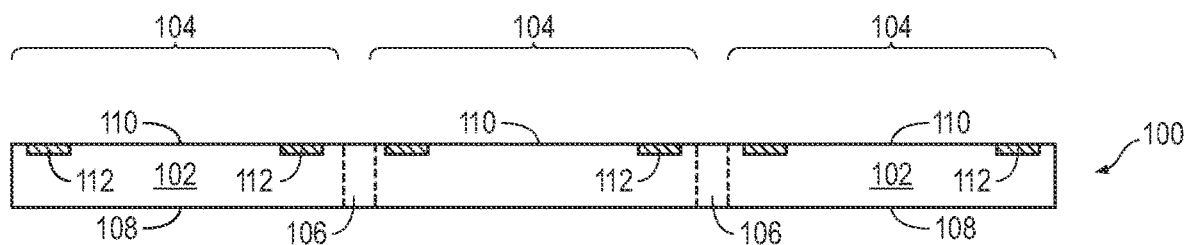

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, sensors, and other circuit elements formed within active surface 110 to implement analog circuits or digital circuits, such as digital signal processor (DSP), application specific integrated circuits (ASIC), memory, discrete electrical devices, or other signal processing circuit. In one embodiment, semiconductor die 104 contains an inductor, capacitor, resistor, diode, transistor, or other discrete electrical device.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Figure 1C:
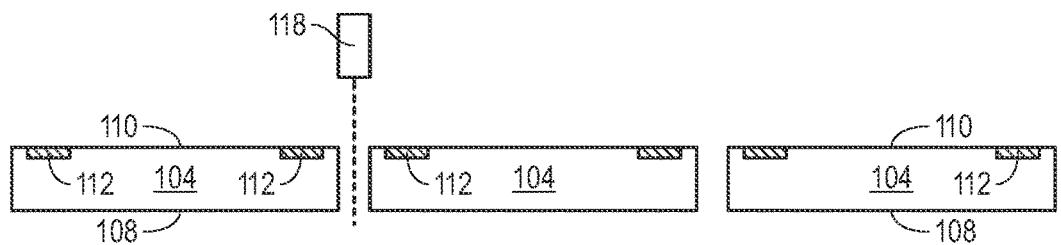

In FIG. 1c, semiconductor wafer 100 is singulated through saw street 106 using a saw blade or laser cutting tool 118 into individual semiconductor die 104. The individual semiconductor die 104 can be inspected and electrically tested for identification of known good die or unit (KGD/KGU) post singulation.

Figure 2A:
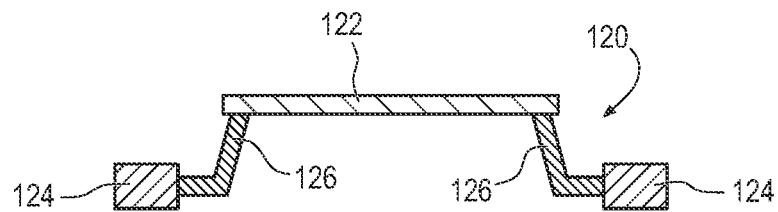
FIGS. 2a-2i illustrate an electrical component bonded to a leadframe and encapsulated.
Figure 2B:
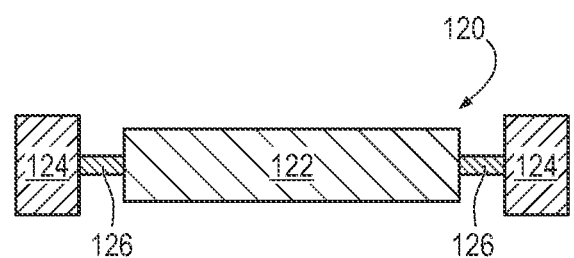
Figure 2C:
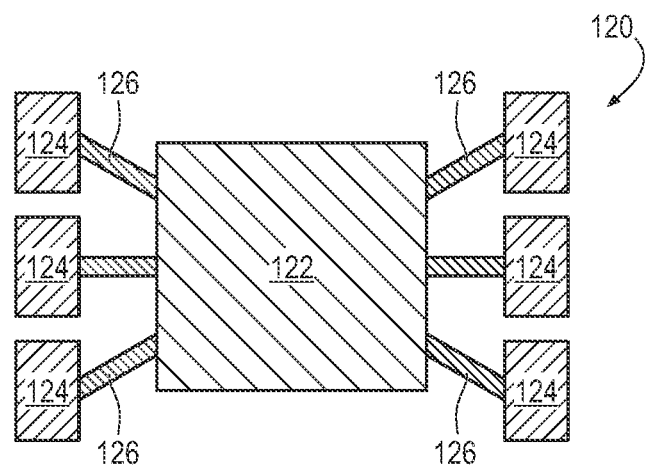
Figure 2D:
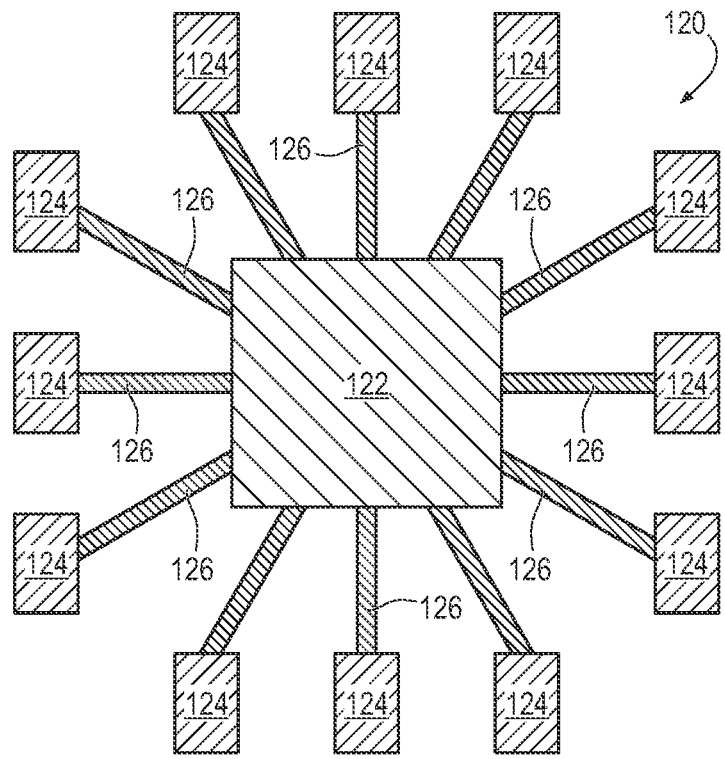

FIGS. 2a-2i illustrate leadframe 120 for mounting and packaging an electrical component. In FIG. 2a, leadframe 120 includes die mounting pad or flag 122, leads 124, and downset segment 126. Leadframe 120 can be made from Au, Ag, Ni, Pt, Cu, Cu alloys (including one or more elements of nickel, iron, zinc, tin, chromium, silver, palladium, and phosphorous), or other suitable conductive materials. Leadframe 130 can be a pre-plated leadframe (PPF) or laminated leadframe. Leadframe 130 can be stamped, etched, or 3D laser printed into any shape corresponding to a leadframe form and function. Leadframe 120 provides structural support and electrical interconnection for electrical components, such as semiconductor die 104. FIG. 2b is a top view of leadframe 120, flag 122 and leads 124 on opposite sides of the flag. FIG. 2c illustrates another embodiment as a top view of leadframe 120, flag 122, and multiple downset leads 124 on two sides of the flag. FIG. 2d illustrates yet another embodiment as a top view of leadframe 120, flag 122, and multiple downset leads 124 on four sides of the flag.

Figure 2E:
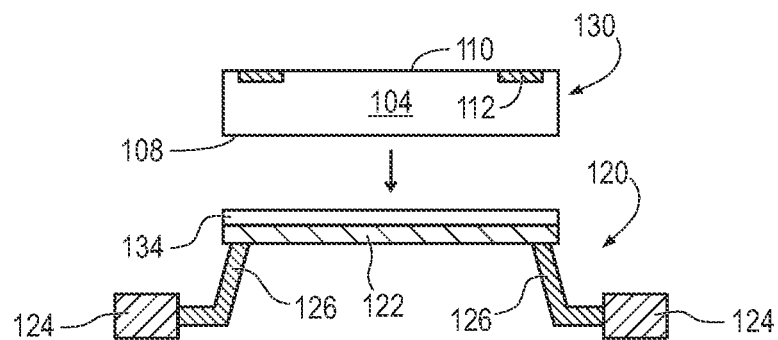
Figure 2F:
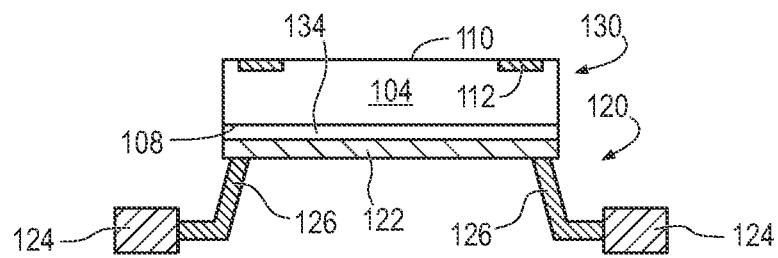

In FIG. 2e, electronic component 130 is positioned over flag 122 of leadframe 120 using a pick and place operation with back surface 108 oriented toward the flag. In one embodiment, electrical component 130 can be semiconductor die 104 from FIG. 1c. Alternatively, electrical component 130 can include other semiconductor die, semiconductor packages, surface mount devices, power amplifier, discrete electrical devices, diode, transistor, or IPDs, such as a resistor, capacitor, and inductor. FIG. 2f shows electrical component 130 bonded to flag 122 with adhesive 134.

Figure 2G:
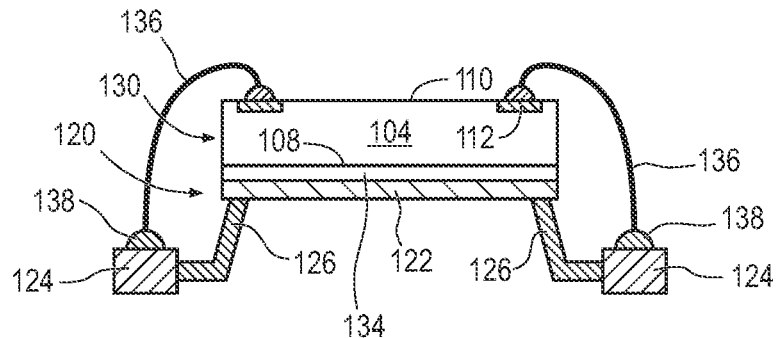

In FIG. 2g, bond wires 136 are connected between contact pads 112 of electrical component 130 and leads 124 using conductive paste 138. Electrical component 130 may have two contact pads 112 corresponding to leadframe 120 in FIG. 2b. Electrical component 130 may have more than two contact pads 112 corresponding to leadframe 120 in FIGS. 2c-2d.

Figure 2H:
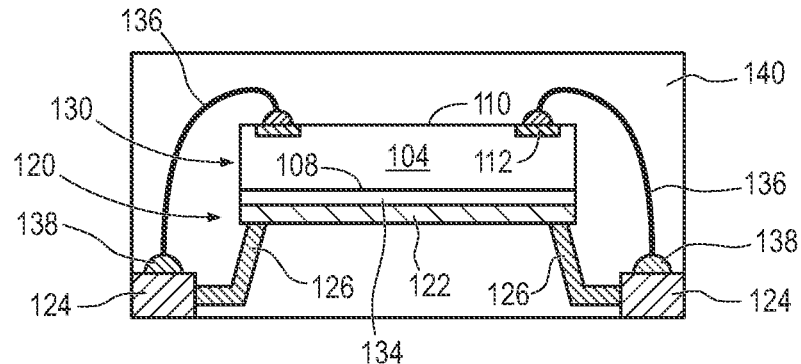

In FIG. 2h, encapsulant or molding compound 140 is deposited around electrical component 130 and leadframe 120 using a paste printing, compressive molding, transfer molding, liquid encapsulant molding, vacuum lamination, spin coating, or other suitable applicator. Encapsulant 140 can be polymer composite material, such as epoxy resin with filler, epoxy acrylate with filler, or polymer with proper filler. Encapsulant 140 is non-conductive, provides structural support, and environmentally protects the semiconductor device from external elements and contaminants. Encapsulant 140 fills the areas over and around electrical component 130, bond wires 136, and leadframe 120.

Figure 2I:
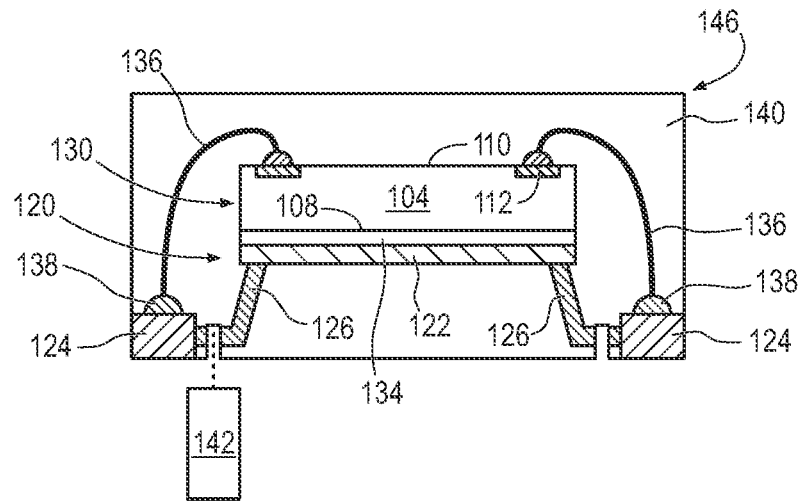

In FIG. 2i, downset segments 126 are cut with cutting tool or laser 142 to isolate leads 124 from flag 122. Bond wires 136 provide the operational electrical connection between contact pads 112 on electrical component 130 and leads 124 as semiconductor package 146. In one embodiment, semiconductor package 146 is a 0603 type package having a length of 1.55 millimeters (mm) and width of 0.85 mm and height of 0.45 mm for surface mount devices (SMD). Alternatively, semiconductor package 146 can be a DFN package having a length of 8.0 mm and width of 8.0 mm and height of 0.85 mm.

Figure 3A:
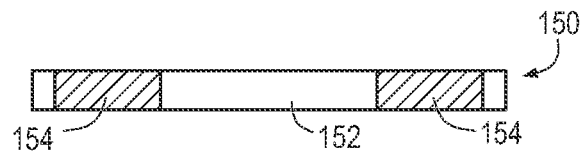
FIGS. 3a-3g illustrate an electrical component bonded to a MIS with bumps.
Figure 3B:
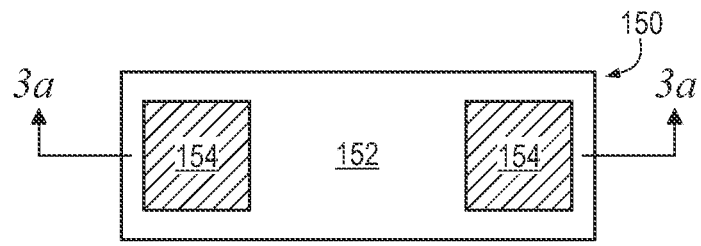
Figure 3C:
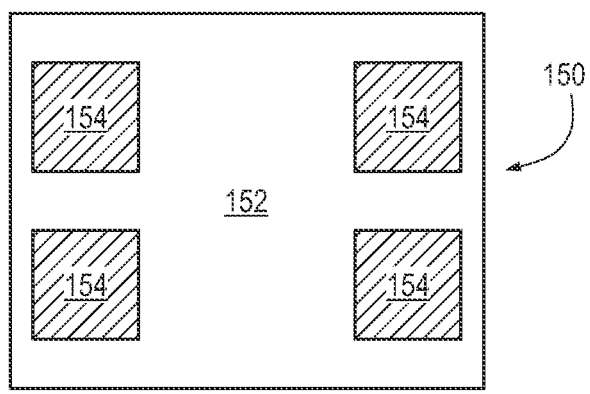
Figure 3D:
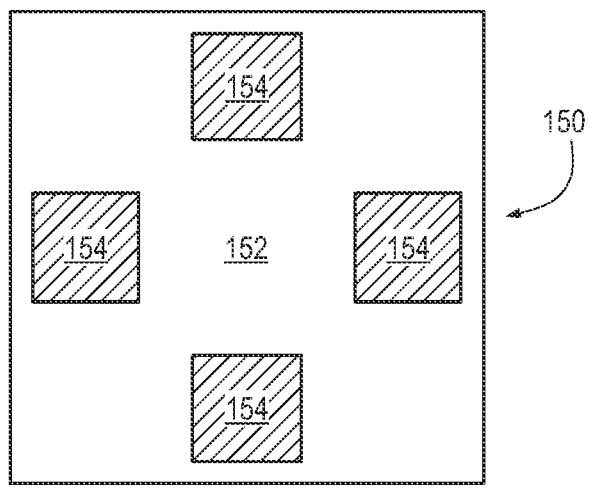

In another embodiment, electrical component 160 is bonded to a leadframe implemented as molded interconnect substrate (MIS) 150. In FIG. 3a, MIS 150 includes non-conductive molding compound 152, such as a silica filled epoxy resin or Ajinomoto buildup film (ABF). Leads 154 are embedded within molding compound 152. Molding compound 152 is non-conductive to electrically isolate leads 154. FIG. 3b is a top view of MIS 150 with molding compound 152 and leads 154. In another embodiment, MIS 150 can have more than two leads. FIG. 3c shows MIS 150 with two leads 154 on each of two sides. FIG. 3d shows MIS 150 with one lead 154 on each of four sides.

Figure 3E:
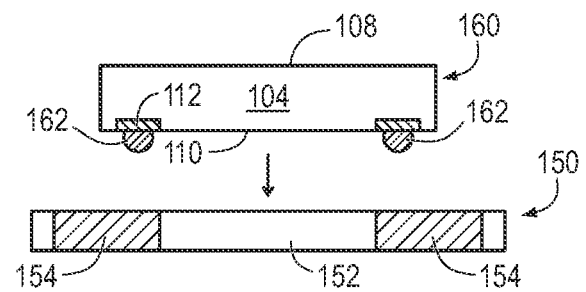
Figure 3F:
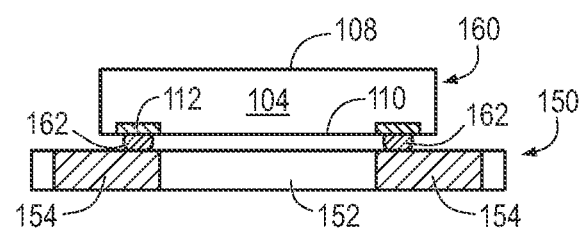

In FIG. 3e, electronic component 160 is positioned over leads 154 using a pick and place operation with active surface 110 and bumps 162 oriented toward the leads. In one embodiment, electrical component 160 can be semiconductor die 104 from FIG. 1c. Alternatively, electrical component 160 can include other semiconductor die, semiconductor packages, surface mount devices, power amplifier, discrete electrical devices, diode, transistor, or IPDs, such as a resistor, capacitor, and inductor. FIG. 3f shows electrical component 160 bonded to MIS 150, as bumps 162 are reflowed to mechanically and electrically connect electrical component 160 to leads 154 of MIS 150.

Figure 3G:
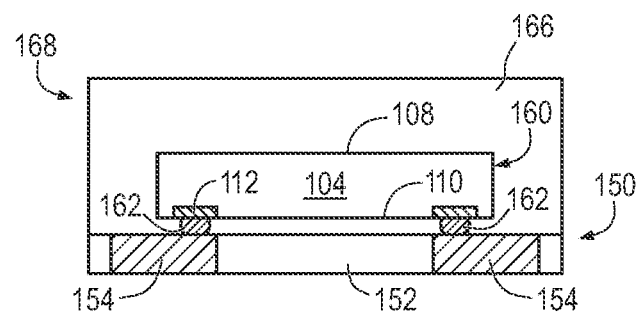

In FIG. 3g, encapsulant or molding compound 166 is deposited around electrical component 160 and MIS 150 using a paste printing, compressive molding, transfer molding, liquid encapsulant molding, vacuum lamination, spin coating, or other suitable applicator. Encapsulant 166 can be polymer composite material, such as epoxy resin with filler, epoxy acrylate with filler, or polymer with proper filler. Encapsulant 166 is non-conductive, provides structural support, and environmentally protects the semiconductor device from external elements and contaminants. Bumps 162 provide the operational electrical connection between contact pads 112 on electrical component 160 and leads 154 as semiconductor package 168. Semiconductor package 168 can be a 0603 type package or DFN package.

Figure 4A:
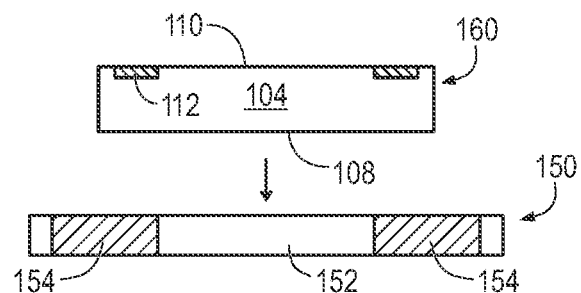
FIGS. 4a-4c illustrate an electrical component bonded to a MIS with bond wires.
Figure 4B:
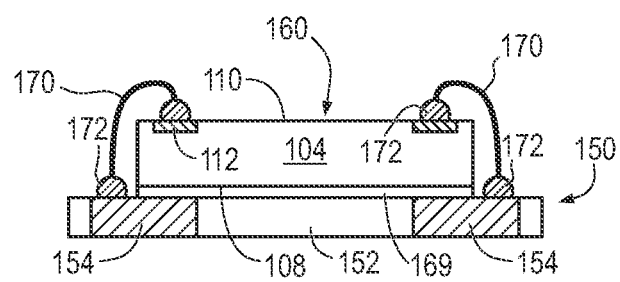

In another embodiment, continuing from FIGS. 3a and 3b, electronic component 160 is positioned over MIS 150 using a pick and place operation with back surface 108 oriented toward the MIS, as shown in FIG. 4a. FIG. 4b shows electrical component 160 bonded to molding compound 152 with adhesive 169. Bond wires 170 are connected between contact pads 112 of electrical component 160 and leads 154 using conductive paste 172. Electrical component 160 may have two contact pads 112 corresponding to MIS 150 in FIG. 4b. Electrical component 160 may have more than two contact pads 112 corresponding to MIS 150 in FIGS. 3c-3d.

Figure 4C:
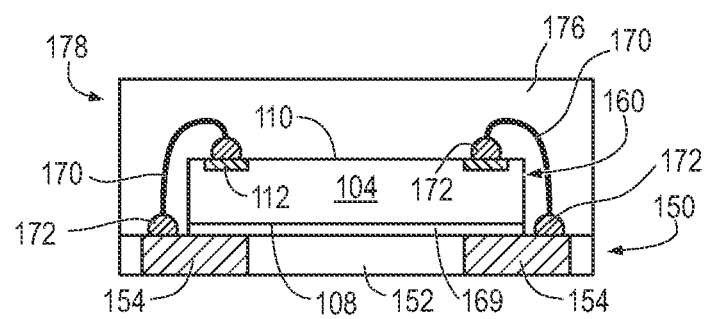

In FIG. 4c, encapsulant or molding compound 176 is deposited around electrical component 160 and MIS 150 using a paste printing, compressive molding, transfer molding, liquid encapsulant molding, vacuum lamination, spin coating, or other suitable applicator. Encapsulant 176 can be polymer composite material, such as epoxy resin with filler, epoxy acrylate with filler, or polymer with proper filler. Encapsulant 176 is non-conductive, provides structural support, and environmentally protects the semiconductor device from external elements and contaminants. Bond wires 170 provide the operational electrical connection between contact pads 112 on electrical component 160 and leads 154 as semiconductor package 178. Semiconductor package 178 can be a 0603 type package or DFN package.

Figure 5A:
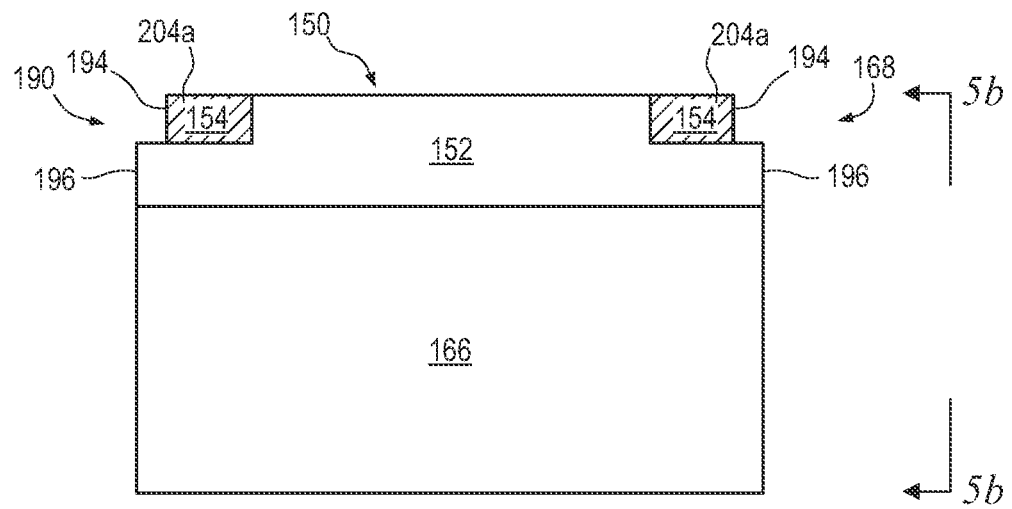
FIGS. 5a-5d illustrate the MIS of FIGS. 3a-3g with 3-sided wettable flank.
Figure 5B:
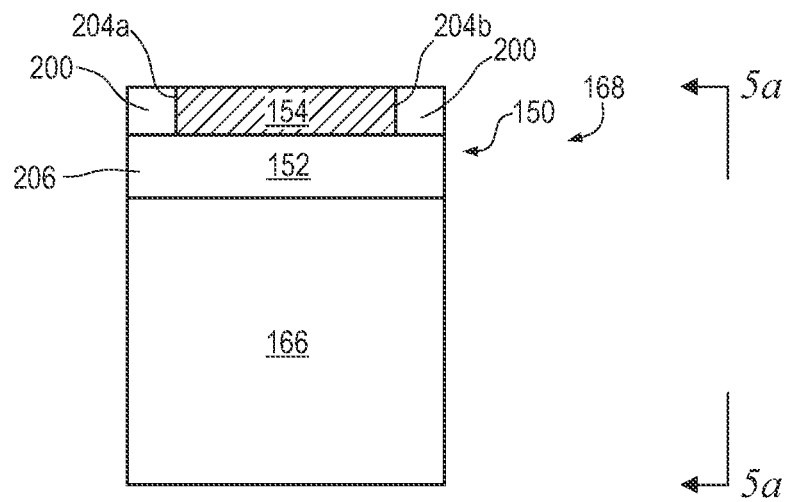

FIGS. 5*a*-5*d* illustrate further detail of lead 154 of semiconductor package 168 or 178. FIG. 5*a* shows a first side view of semiconductor package 168, including MIS 150, molding compound 152, leads 154, and encapsulant 166. A portion of molding compound 152 is removed by etching or laser direct ablation (LDA) around lead 154 to leave gap or separation 190 between surface 194 of lead 154 and surface 196 of molding compound 152. Gap 190 represents an absence of molding compound on surface 194 of lead 154. FIG. 5*b* shows a second side view of semiconductor package 168. Removing the portion of molding compound 152 around lead 154 also leaves gap or separation 200 between surface 204*a* of lead 154 and surface 206 of molding compound 152, and gap or separation 200 between surface 204*b* of lead 154 and surface 206 of molding compound 152. Gap 200 represents an absence of molding compound on surfaces 204*a* and 204*b* of lead 154. In another embodiment, MIS 150 is formed with no molding compound in gap 190 and gap 200.

Figure 5C:
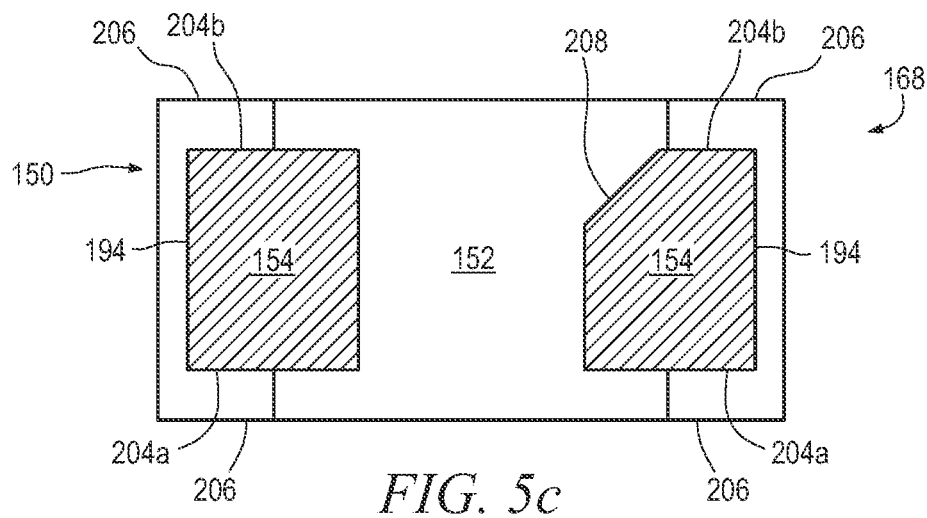
Figure 5D:
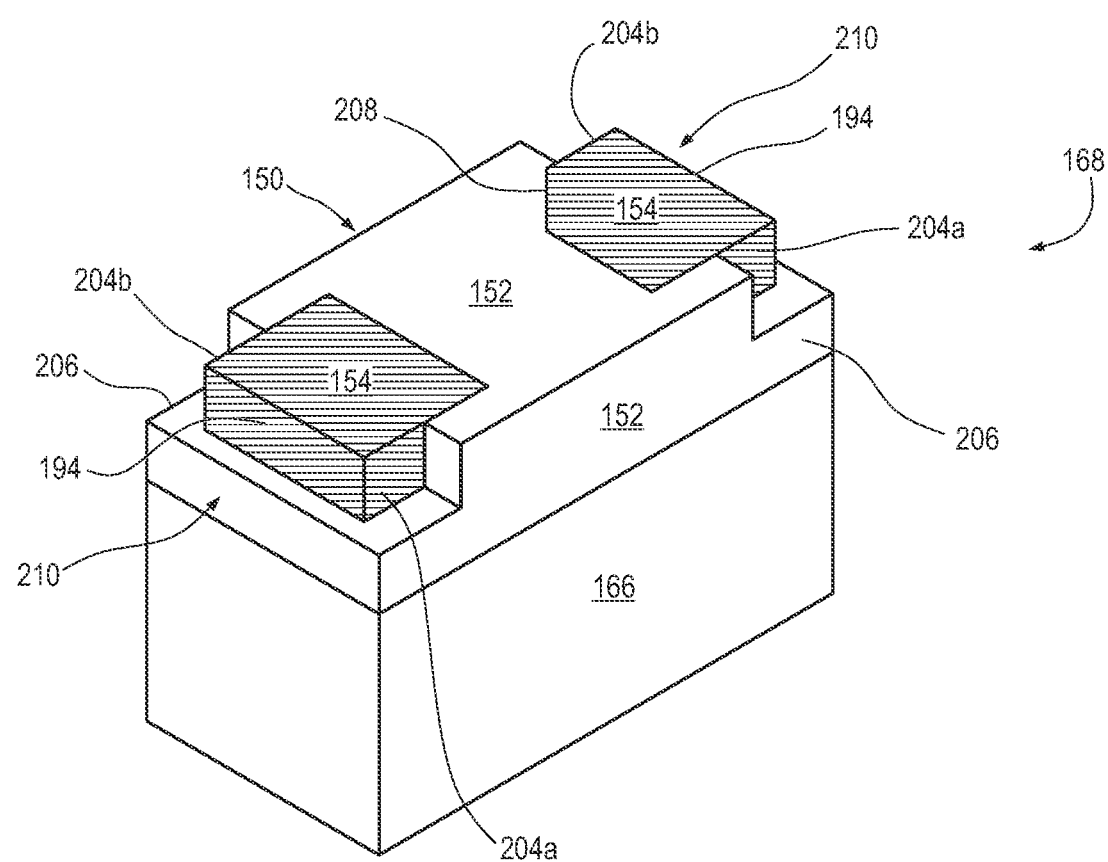

FIG. 5*c* shows a bottom view of semiconductor package 168 showing surfaces 194 and 204*a*-204*b* and described in FIGS. 5*a*-5*b*. Angled cut 208 in lead 154 can be used to indicate polarity of electrical component 160. FIG. 5*d* is a perspective view of semiconductor package 168. There is no encapsulant on surfaces 194 and 204*a*-204*b* of lead 154. Leads 154 can be Cu. Surfaces 194 and 204*a*-204*b* are plated with Ni/Pd/Au alloy using electroplating or electroless plating for wettability. Surface 194 of lead 154 represents a first wettable side of flank 210. Surface 204*a* of lead 154 represents a second wettable side of flank 210. Surface 204*b* of lead 154 represents a third wettable side of flank 210. Accordingly, flank 210 has three visible sides or 3-sided wettable flank. A wettable sidewall is adapted for solder or other electrical joining compound to adhere to, i.e., a solderable surface.

Semiconductor package 168 with 3-sided wettable flank leads 154 provides high package shear strengths, more solder joint reliability, better package mount coplanarity and tilt, and provisions for AOI by nature of the 3-sided solder fillet. Surfaces 194 and 204*a*-204*b* of leads 154 increase the electrical connection surface area for a lower resistance contact and greater cross-sectional area for higher solder shear strength. Surfaces 194 and 204*a*-204*b* also increase package stability during mounting to reduce defects, such as package tilt, package rotation, tombstoning, due to imbalances in surface tension of solder during mounting process.

Figure 6A:
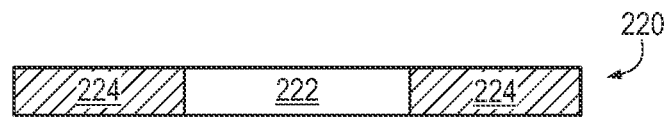
FIGS. 6a-6d illustrate an electrical component bonded to a MIS with bumps or bond wires.
Figure 6B:
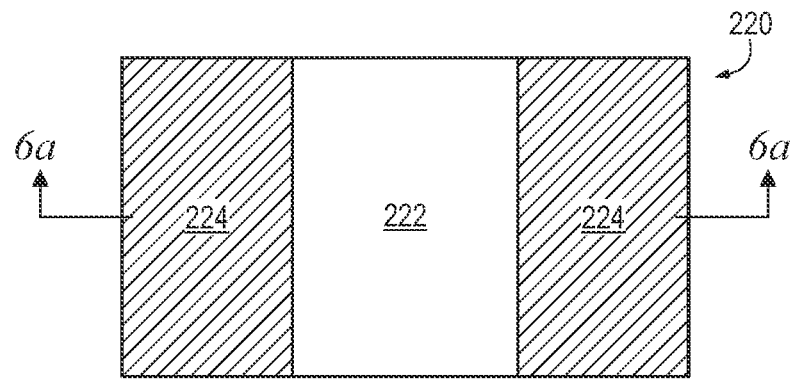

FIGS. 6*a*-6*d* show another embodiment of leadframe or MIS 220. In FIG. 6*a*, MIS 220 includes non-conductive molding compound 222, such as a silica filled epoxy resin or ABF. Leads 224 extend from molding compound 222. Molding compound 222 is non-conductive to electrically isolate leads 224. FIG. 6*b* is a top view of MIS 220 with molding compound 222 and leads 224. In another embodiment, MIS 220 can have more than two leads, similar to FIGS. 3*c*-3*d*.

Figure 6C:
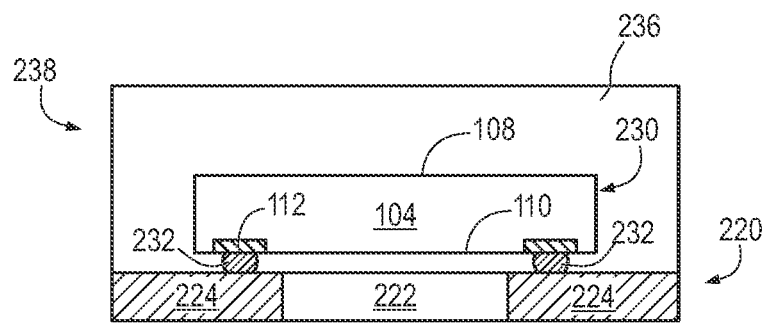

Electronic component 230 is positioned over leads 224 using a pick and place operation with active surface 110 and bumps 232 oriented toward the leads, similar to FIG. 3*e*. In one embodiment, electrical component 230 can be semiconductor die 104 from FIG. 1*c*. Alternatively, electrical component 230 can include other semiconductor die, semiconductor packages, surface mount devices, power amplifier, discrete electrical devices, diode, transistor, or IPDs, such as a resistor, capacitor, and inductor. FIG. 6*c* shows electrical component 230 bonded to MIS 220, as bumps 232 are reflowed to mechanically and electrically connect electrical component 230 to leads 224 of MIS 220.

Encapsulant or molding compound 236 is deposited around electrical component 230 and MIS 220 using a paste printing, compressive molding, transfer molding, liquid encapsulant molding, vacuum lamination, spin coating, or other suitable applicator, similar to FIG. 3*g*. Encapsulant 236 can be polymer composite material, such as epoxy resin with filler, epoxy acrylate with filler, or polymer with proper filler. Encapsulant 236 is non-conductive, provides structural support, and environmentally protects the semiconductor device from external elements and contaminants. Bumps 232 provide the operational electrical connection between contact pads 112 on electrical component 230 and leads 224 as semiconductor package 238. Semiconductor package 238 can be a 0603 type package or DFN package.

Figure 6D:
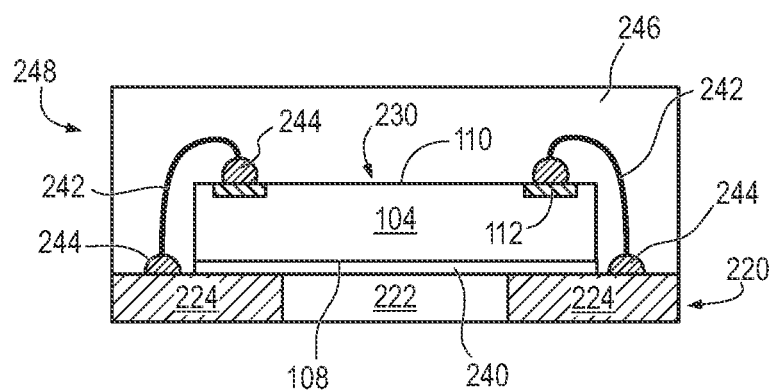

In another embodiment, electronic component 230 is positioned over MIS 220 using a pick and place operation with back surface 108 oriented toward the MIS, similar to FIG. 4*a*. FIG. 6*d* shows electrical component 230 bonded to molding compound 222 with adhesive 240. Bond wires 242 are connected between contact pads 112 of electrical component 230 and leads 224 using conductive paste 244, similar to FIG. 4*b*. Electrical component 230 may have two or more contact pads 112.

Encapsulant or molding compound 246 is deposited around electrical component 230 and MIS 220 using a paste printing, compressive molding, transfer molding, liquid encapsulant molding, vacuum lamination, spin coating, or other suitable applicator. Encapsulant 246 can be polymer composite material, such as epoxy resin with filler, epoxy acrylate with filler, or polymer with proper filler. Encapsulant 246 is non-conductive, provides structural support, and environmentally protects the semiconductor device from external elements and contaminants. Bond wires 242 provide the operational electrical connection between contact pads 112 on electrical component 230 and leads 224 as semiconductor package 248. Semiconductor package 248 can be a 0603 type package or DFN package.

Figure 7A:
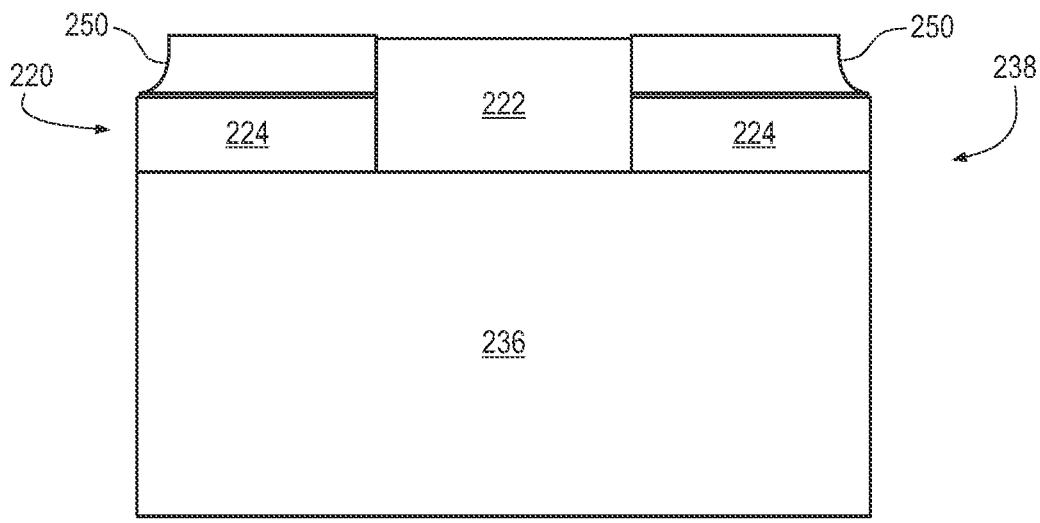
FIGS. 7a-7d illustrate the MIS of FIGS. 6a-6d with 3-sided wettable flank.
Figure 7B:
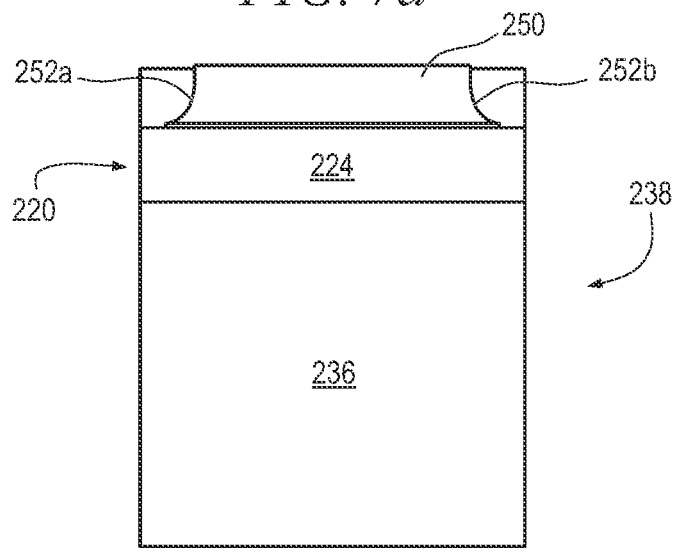
Figure 7C:
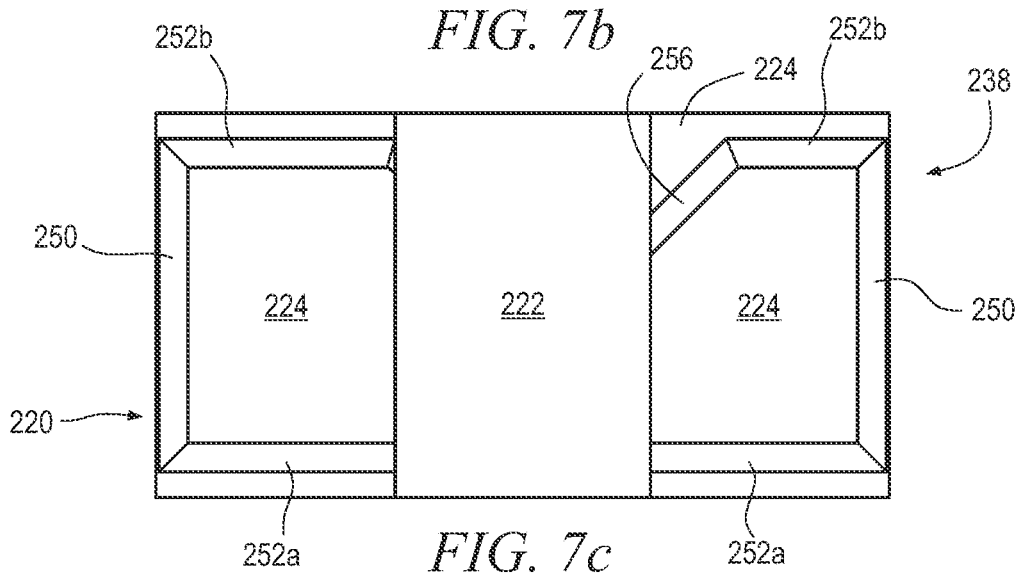
Figure 7D:
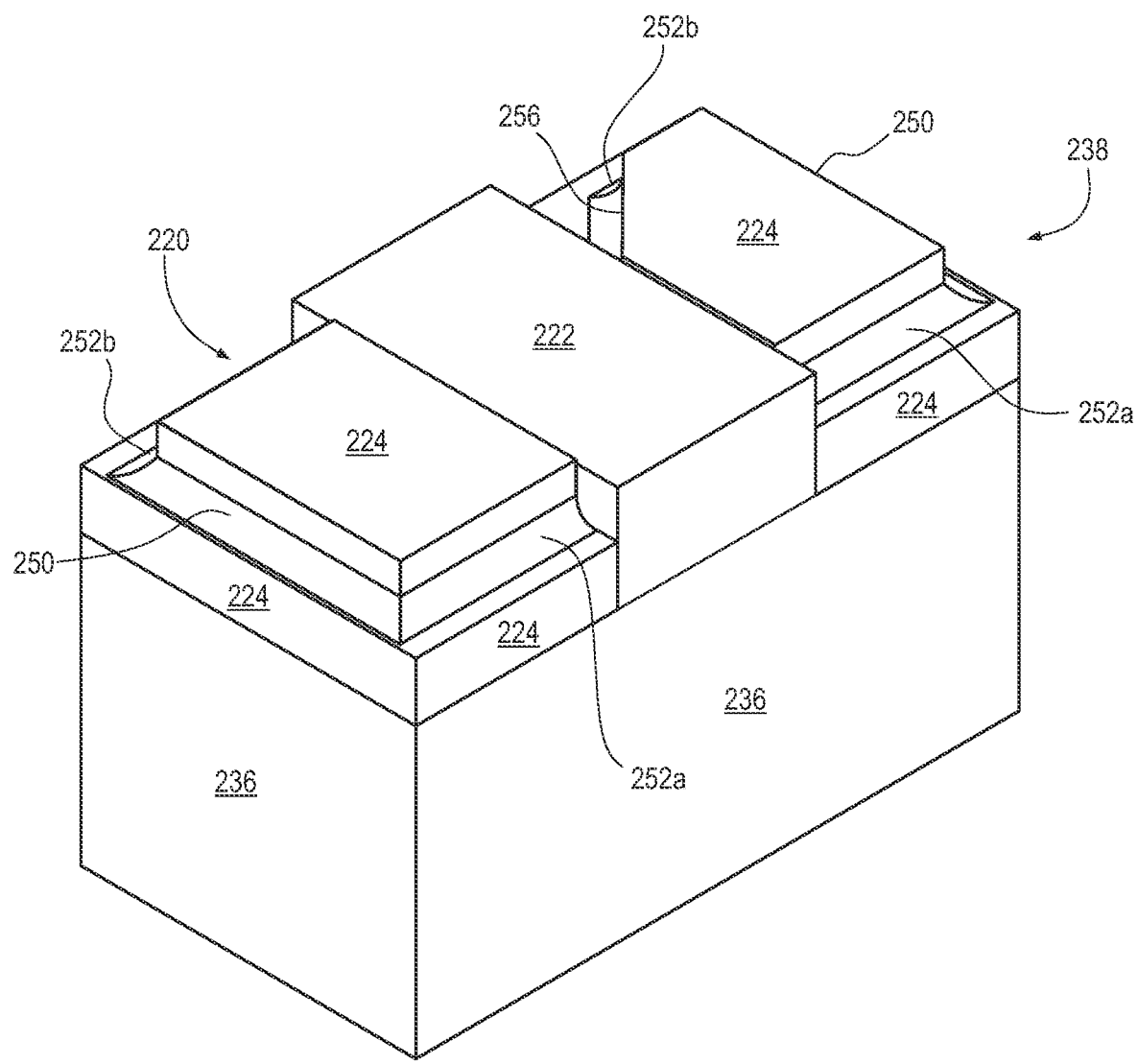

FIGS. 7*a*-7*d* illustrate further detail of lead 224 of semiconductor package 238 or 248. FIG. 7*a* shows a first side view of semiconductor package 238, including MIS 220, molding compound 222, leads 224, and encapsulant 236. A portion of lead 224 is removed by etching or LDA to leave recessed or partially curved surface 250. FIG. 7*b* shows a second side view of semiconductor package 238. Removing the portion of lead 224 also leaves recessed or partially curved surface 252*a* and recessed or partially curved surface 252*b*. FIG. 7*c* shows a bottom view of semiconductor package 238 showing surfaces 250, 252*a*, and 252*b* and described in FIGS. 7*a*-7*b*. Angled cut 256 in lead 224 can be used to indicate polarity of electrical component 230. FIG. 7*d* is a perspective view of semiconductor package 238. Leads 224 can be Cu. Surfaces 250, 252*a*, and 252*b* are plated with Ni/Pd/Au alloy using electroplating or electroless plating for wettability. Surface 250 of lead 224 represents a first wettable side of flank 258. Surface 252*a* of lead 224 represents a second wettable side of flank 258. Surface 252*b* of lead 224 represents a third wettable side of flank 258. Accordingly, flank 258 has three visible sides or 3-sided wettable flank. A wettable sidewall is adapted for solder or other electrical joining compound to adhere to. i.e., a solderable surface.

Semiconductor package 238/248 with 3-sided wettable flank leads 224 provide high package shear strengths, more solder joint reliability, better package mount coplanarity and tilt, and provisions for AOI by nature of the solder fillet. Surfaces 250 and 252a-252b of leads 224 increase the electrical connection surface area for a lower resistance contact and greater cross-sectional area for higher solder shear strength. Surfaces 250 and 252a-252b also increase package stability during mounting to reduce defects, such as package tilt, package rotation, tombstoning, due to imbalances in surface tension of solder during mounting process.

Figure 8A:
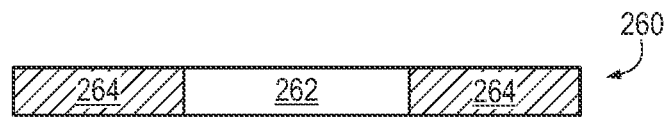
FIGS. 8a-8d illustrate an electrical component bonded to a MIS with bumps or bond wires.
Figure 8B:
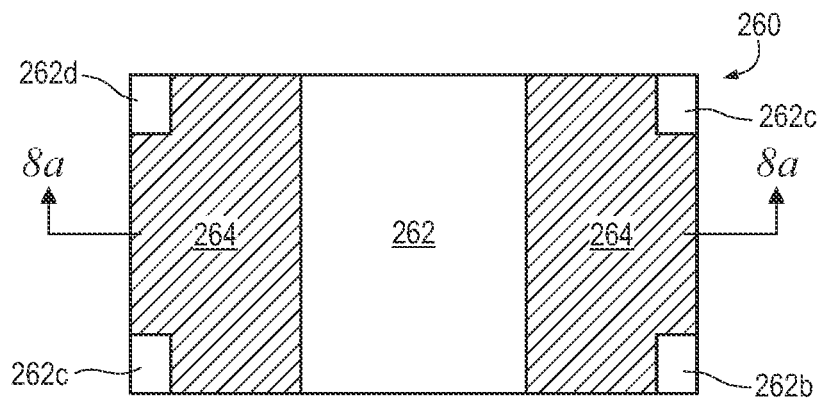

FIGS. 8a-8d show another embodiment of leadframe or MIS 260. In FIG. 8a, MIS 260 includes non-conductive molding compound 262, such as a silica filled epoxy resin or ABF. Leads 264 extend from molding compound 262. Molding compound 262 is non-conductive to electrically isolate leads 264. FIG. 8b is a top view of MIS 260 with molding compound 262 and leads 264. Molding compound 262a-262d represent portions of the molding compound at the corners of MIS 260. In another embodiment, MIS 260 can have more than two leads, similar to FIGS. 3c-3d.

Figure 8C:
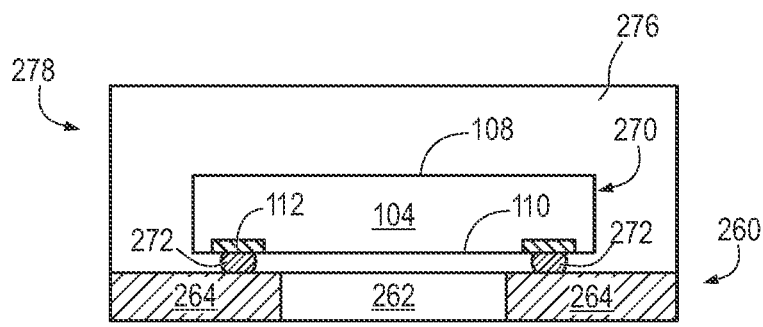

Electronic component 270 is positioned over leads 264 using a pick and place operation with active surface 110 and bumps 272 oriented toward the leads, similar to FIG. 3e. In one embodiment, electrical component 270 can be semiconductor die 104 from FIG. 1c. Alternatively, electrical component 270 can include other semiconductor die, semiconductor packages, surface mount devices, power amplifier, discrete electrical devices, diode, transistor, or IPDs, such as a resistor, capacitor, and inductor. FIG. 8c shows electrical component 270 bonded to MIS 260, as bumps 272 are reflowed to mechanically and electrically connect electrical component 270 to leads 264 of MIS 260.

Encapsulant or molding compound 276 is deposited around electrical component 270 and MIS 260 using a paste printing, compressive molding, transfer molding, liquid encapsulant molding, vacuum lamination, spin coating, or other suitable applicator, similar to FIG. 3g. Encapsulant 276 can be polymer composite material, such as epoxy resin with filler, epoxy acrylate with filler, or polymer with proper filler. Encapsulant 276 is non-conductive, provides structural support, and environmentally protects the semiconductor device from external elements and contaminants. Bumps 272 provide the operational electrical connection between contact pads 112 on electrical component 270 and leads 264 as semiconductor package 278. Semiconductor package 278 can be a 0603 type package or DFN package.

Figure 8D:
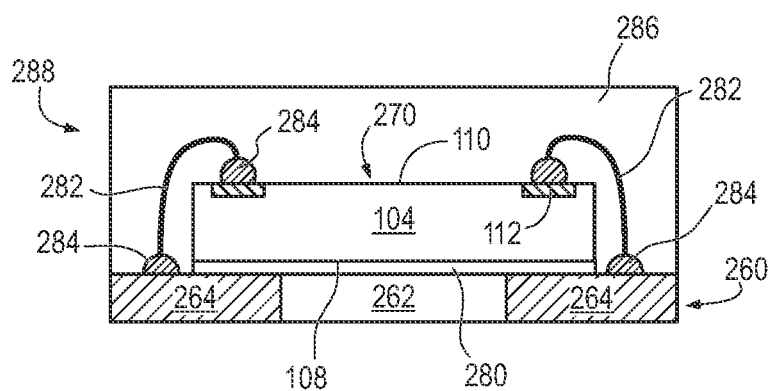

In another embodiment, electronic component 270 is positioned over MIS 260 using a pick and place operation with back surface 108 oriented toward the MIS, similar to FIG. 4a. FIG. 8d shows electrical component 270 bonded to molding compound 262 with adhesive 280. Bond wires 282 are connected between contact pads 112 of electrical component 270 and leads 264 using conductive paste 284, similar to FIG. 4b. Electrical component 230 may have two or more contact pads 112.

Encapsulant or molding compound 286 is deposited around electrical component 270 and MIS 260 using a paste printing, compressive molding, transfer molding, liquid encapsulant molding, vacuum lamination, spin coating, or other suitable applicator. Encapsulant 286 can be polymer composite material, such as epoxy resin with filler, epoxy acrylate with filler, or polymer with proper filler. Encapsulant 286 is non-conductive, provides structural support, and environmentally protects the semiconductor device from external elements and contaminants. Bond wires 282 provide the operational electrical connection between contact pads 112 on electrical component 270 and leads 264 as semiconductor package 288. Semiconductor package 288 can be a 0603 type package or DFN package.

Figure 9A:
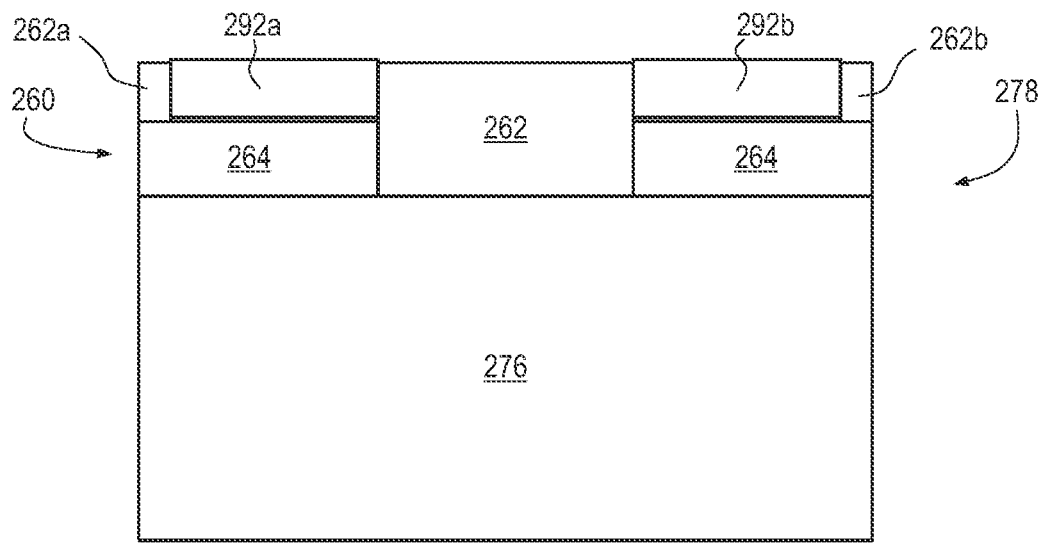
FIGS. 9a-9d illustrate the MIS of FIGS. 8a-8d with 3-sided wettable flank.
Figure 9B:
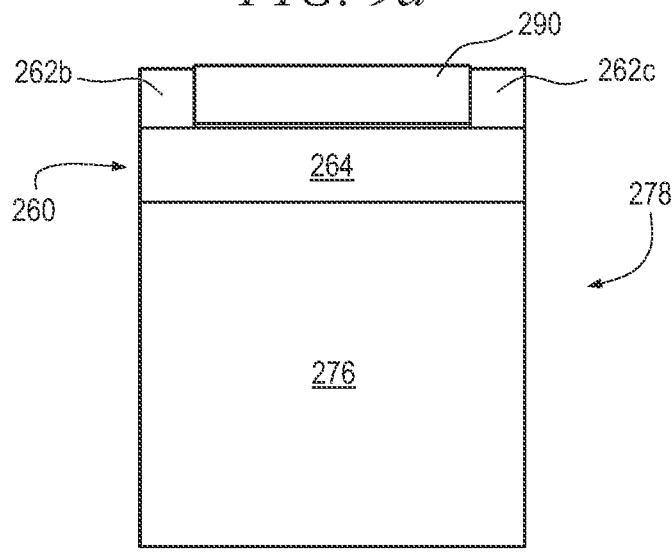
Figure 9C:
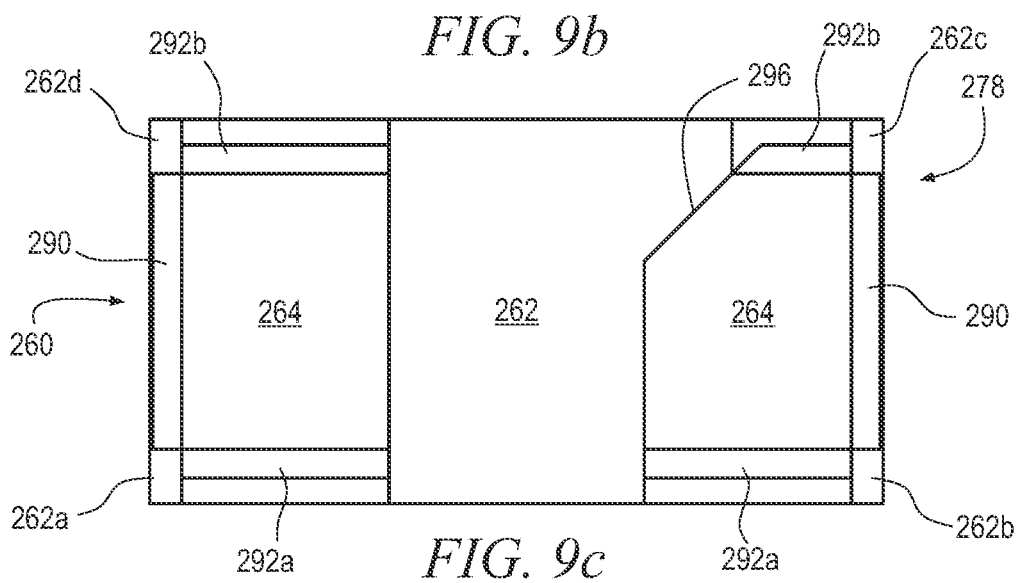
Figure 9D:
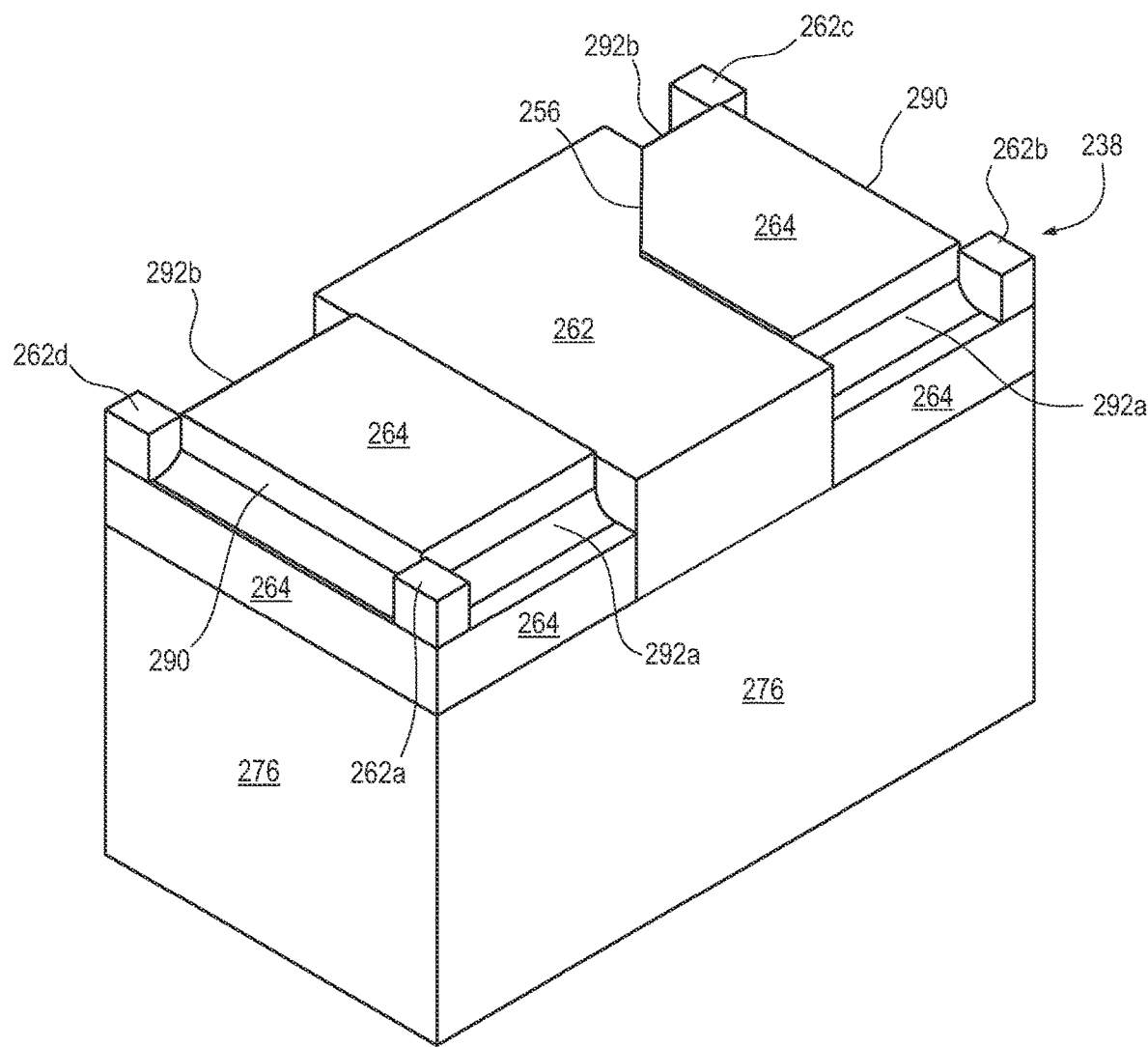

FIGS. 9a-9d illustrate further detail of lead 264 of semiconductor package 278 or 278. FIG. 9a shows a first side view of semiconductor package 278, including MIS 260, molding compound 262, leads 264, and encapsulant 276. A portion of lead 264 is removed by etching or LDA to leave recessed surface 290. Portions 262a-262d of molding compound 262 remain at corners of MIS 260. FIG. 9b shows a second side view of semiconductor package 278. Removing the portion of lead 264 also leaves recessed surface 292a and recessed surface 292b. FIG. 9c shows a bottom view of semiconductor package 278 showing surfaces 290, 292a, and 292b and described in FIGS. 9a-9b. Angled cut 296 in lead 264 can be used to indicate polarity of electrical component 270. FIG. 9d is a perspective view of semiconductor package 278. Leads 264 can be Cu. Surfaces 290, 292a, and 292b are plated with Ni/Pd/Au alloy using electroplating or electroless plating for wettability. Surface 290 of lead 264 represents a first wettable side of flank 298. Surface 292a of lead 264 represents a second wettable side of flank 298. Surface 292b of lead 264 represents a third wettable side of flank 298. Accordingly, flank 298 has three visible sides or 3-sided wettable flank. A wettable sidewall is adapted for solder or other electrical joining compound to adhere to, i.e., a solderable surface. Corner molding compound 262a-262d reduces Cu smearing.

Semiconductor package 278/288 with 3-sided wettable flank leads 264 provides high package shear strengths, more solder joint reliability, better package mount coplanarity and tilt, and provisions for AOI by nature of the solder fillet. Surfaces 290 and 292a-292b of leads 264 increase the electrical connection surface area for a lower resistance contact and greater cross-sectional area for higher solder shear strength. Surfaces 290 and 292a-292b also increase package stability during mounting to reduce defects, such as package tilt, package rotation, tombstoning, due to imbalances in surface tension of solder during mounting process.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate including a first surface and a second surface on a same side of the substrate as the first surface and vertically offset from the first surface;
   a lead at least partially embedded in the first surface of the substrate and partially exposed from the substrate over the second surface of the substrate, wherein a top surface of the lead is coplanar with the first surface of the substrate and a width of the lead across the second surface is less than a width of the substrate across the first surface and the lead is exposed from the second surface of the substrate on at least three side surfaces of the lead extending vertically from the first surface of the substrate with a gap extending from one of the at least three side surfaces over the second surface of the substrate to a side surface of the substrate;
   an electrical component disposed over the substrate and electrically connected to the lead; and
   a wettable flank formed on the at least three side surfaces of the lead.

2. The semiconductor device of claim 1, wherein the substrate further includes a molding compound and the lead is at least partially embedded in the molding compound.

3. The semiconductor device of claim 2, wherein a portion of the molding compound remains at corners of the substrate.

4. The semiconductor device of claim 1, wherein the lead includes a first surface on a first side of the lead, a second surface on a second side of the lead, and a third surface on a third side of the lead.

5. The semiconductor device of claim 1, wherein the lead includes a first recessed surface on a first side of the lead, a second recessed surface on a second side of the lead, and a third recessed surface on a third side of the lead.

6. The semiconductor device of claim 1, wherein a portion of a surface of the lead is plated.

7. A semiconductor device, comprising:
a non-conductive substrate including a first surface and a second surface on a same side of the non-conductive substrate as the first surface and vertically offset from the first surface;
an electrical component disposed over the non-conductive substrate;
a lead at least partially embedded in the first surface of the non-conductive substrate and partially exposed from the non-conductive substrate over the second surface of the non-conductive substrate, wherein the lead is exposed from the second surface of the non-conductive substrate on at least three side surfaces of the lead extending vertically from the first surface of the non-conductive substrate with a gap extending from one of the at least three side surfaces over the second surface of the non-conductive substrate to a side surface of the non-conductive substrate; and
a wettable flank formed on the at least three side surfaces of the lead.

8. The semiconductor device of claim 7, wherein the non-conductive substrate includes a molding compound and the lead is at least partially embedded in the molding compound.

9. The semiconductor device of claim 8, wherein a portion of the molding compound remains at corners of the non-conductive substrate.

10. The semiconductor device of claim 7, wherein the lead includes a first surface on a first side of the lead, a second surface on a second side of the lead, and a third surface on a third side of the lead.

11. The semiconductor device of claim 7, wherein the lead includes a first recessed surface on a first side of the lead, a second recessed surface on a second side of the lead, and a third recessed surface on a third side of the lead.

12. The semiconductor device of claim 7, wherein a portion of a surface of the lead is plated.

13. The semiconductor device of claim 7, wherein the leads are formed on two or more sides of the non-conductive substrate.

14. A method of making a semiconductor device, comprising:
providing a non-conductive substrate including a first surface and a second surface on a same side of the non-conductive substrate as the first surface and vertically offset from the first surface;
forming a lead at least partially embedded in the first surface of the non-conductive substrate and partially exposed from the non-conductive substrate over the second surface of the non-conductive substrate, wherein the lead is exposed from the second surface of the non-conductive substrate on at least three side surfaces of the lead extending vertically from the first surface of the non-conductive substrate with a gap extending from one of the at least three side surfaces over the second surface of the non-conductive substrate to a side surface of the non-conductive substrate;
disposing an electrical component over the non-conductive substrate; and
forming a wettable flank on at least three side surfaces of the lead.

15. The method of claim 14, wherein providing the non-conductive substrate includes:
providing a molding compound; and
embedding the lead at least partially in the molding compound.

16. The method of claim 15, further including leaving a portion of the molding compound at corners of the non-conductive substrate.

17. The method of claim 14, wherein the lead includes a first surface on a first side of the lead, a second surface on a second side of the lead, and a third surface on a third side of the lead.

18. The method of claim 14, wherein the lead includes a first recessed surface on a first side of the lead, a second recessed surface on a second side of the lead, and a third recessed surface on a third side of the lead.

19. The method of claim 14, further including plating a portion of a surface of the lead.

20. The method of claim 14, further including forming the leads on two or more sides of the non-conductive substrate.

21. A semiconductor device, comprising:
a substrate including a first surface and a second surface on a same side of the substrate as the first surface and vertically offset from the first surface;
a lead at least partially embedded in the first surface of the substrate and partially exposed from the substrate over the second surface of the substrate, wherein the lead is exposed from the second surface of the substrate on at least three side surfaces of the lead extending vertically from the first surface of the substrate;
an electrical component disposed over the substrate and electrically connected to the lead; and
a wettable flank formed on a plurality of sides of the lead.

22. The semiconductor device of claim 21, further including a molding compound disposed over the substrate with the lead at least partially embedded in the molding compound.

23. The semiconductor device of claim 22, wherein a portion of the molding compound remains at corners of the substrate.

24. The semiconductor device of claim 21, wherein the lead includes a first surface on a first side of the lead, a second surface on a second side of the lead, and a third surface on a third side of the lead.

25. The semiconductor device of claim 21, wherein the lead includes a first recessed surface on a first side of the lead, a second recessed surface on a second side of the lead, and a third recessed surface on a third side of the lead.

* * * * *